(12) United States Patent
Sirard et al.

(10) Patent No.: US 7,981,699 B2
(45) Date of Patent: Jul. 19, 2011

(54) METHOD FOR TUNABLY REPAIRING LOW-K DIELECTRIC DAMAGE

(75) Inventors: Stephen M. Sirard, San Jose, CA (US); James DeYoung, Dallas, TX (US); Odette Turmel, Fremont, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 12/604,222

(22) Filed: Oct. 22, 2009

(65) Prior Publication Data

US 2011/0097821 A1 Apr. 28, 2011

(51) Int. Cl.
*H01L 21/00* (2006.01)
(52) U.S. Cl. .......................................................... 438/4
(58) Field of Classification Search .................. 438/4
See application file for complete search history.

(56) References Cited

U.S. PATENT DOCUMENTS

| | | | |
|---|---|---|---|
| 6,208,014 B1 | 3/2001 | Wu et al. | |
| 6,962,869 B1 | 11/2005 | Bao et al. | |
| 7,011,868 B2 | 3/2006 | Waldfried et al. | |
| 7,029,826 B2 | 4/2006 | Hacker et al. | |
| 7,541,200 B1* | 6/2009 | van Schravendijk et al. | 438/4 |
| 2004/0072436 A1* | 4/2004 | RamachandraRao et al. | 438/692 |
| 2006/0172531 A1 | 8/2006 | Lin et al. | |
| 2006/0216952 A1* | 9/2006 | Bhanap et al. | 438/780 |
| 2007/0298163 A1 | 12/2007 | DeYoung | |
| 2008/0199977 A1 | 8/2008 | Weigel et al. | |
| 2009/0140418 A1* | 6/2009 | Li et al. | 438/694 |

FOREIGN PATENT DOCUMENTS

WO  WO 2009/085098 A1  7/2009

OTHER PUBLICATIONS

Gerald L. Witucki, "A Silane Primer: Chemistry and Applications of Alkoxy Silanes," Journal of Coatings Technology, vol. 65, No. 822, Jul. 1993, pp. 57-60.
U.S. Appl. No. 12/604,224, filed Oct. 22, 2009, entitled "Method for Repairing Low-K Dielectric Damage," by Sirard et al.

* cited by examiner

*Primary Examiner* — Charles D Garber
*Assistant Examiner* — Bryan R Junge
(74) *Attorney, Agent, or Firm* — Beyer Law Group LLP (57) ABSTRACT

A method for providing a tuned repair for damage to a silicon based low-k dielectric layer with organic compounds, where damage replaces a methyl attached to silicon with a hydroxyl attached to silicon is provided. A precursor gas is provided, comprising a first repair agent represented as $Si-(R)_x(OR')_y$, where $y \geq 1$ and $x+y=4$, and wherein R is an alkyl or aryl group and R' is an alkyl or aryl group and a second repair agent represented as $Si-(R)_x(OR')_yR''$, where $y \geq 1$ and $x+y=3$, and wherein R is an alkyl or aryl group and R' is an alkyl or aryl group, and R'' is of a group that reduces interfacial surface tension between a wet clean chemical and the low-k dielectric. Some of the first repair agent and second repair agent are bonded to the low-k dielectric to form a monolayer of the first repair agent and the second repair agent.

12 Claims, 9 Drawing Sheets

METHOD FOR TUNABLY REPAIRING LOW-K DIELECTRIC DAMAGE

BACKGROUND OF THE INVENTION

1. Field of the Invention

The invention relates to a method of obtaining a structure on a semiconductor wafer by etching through a low-k silicon based organic dielectric layer.

2. Description of the Related Art

In semiconductor plasma etching applications, a plasma etcher is usually used to transfer an organic mask pattern, such as a photoresist mask pattern, into a circuit and line pattern of a desired thin film and/or filmstack (conductors or dielectric insulators) on a Si wafer. This is achieved by etching away the films (and filmstacks) underneath the photoresist materials in the opened areas of the mask pattern. This etching reaction is initiated by the chemically active species and electrically charged particles (ions) generated by exciting an electric discharge in a reactant mixture contained in a vacuum enclosure, also referred to as a reactor chamber. Additionally, the ions are also accelerated towards the wafer materials through an electric field created between the gas mixture and the wafer materials, generating a directional removal of the etching materials along the direction of the ion trajectory in a manner referred to as anisotropic etching. At the finish of the etching sequence, the masking materials are removed by stripping it away, leaving in its place a replica of the lateral pattern of the original intended mask patterns.

SUMMARY OF THE INVENTION

To achieve the foregoing and in accordance with the purpose of the present invention, a method for providing a tuned repair for damage to a silicon based low-k dielectric layer with organic compounds, where damage replaces a methyl attached to silicon with a hydroxyl attached to silicon is provided. A precursor gas is provided, comprising a first repair agent represented as $Si—(R)_x(OR')_y$, where $y \geq 1$ and $x+y=4$, and wherein R is an alkyl or aryl group and R' is an alkyl or aryl group and a second repair agent represented as $Si—(R)_x(OR')_yR''$, where $y \geq 1$ and $x+y=3$, and wherein R is an alkyl or aryl group and R' is an alkyl or aryl group, and R'' is of a group that reduces interfacial surface tension between a wet clean chemical and the low-k dielectric. Some of the first repair agent and second repair agent are bonded to the low-k dielectric to form a monolayer of the first repair agent and the second repair agent.

In another manifestation of the invention, a method for providing a tuned repair for damage to a silicon based low-k dielectric layer with organic compounds, where damage replaces a methyl attached to silicon with a hydroxyl attached to silicon is provided. A repair layer is formed on a surface of the damaged silicon based low-k dielectric layer, which replaces silanol (Si—OH) bonds with Si—C or $CH_3$ bonds. The repair layer is exposed to a plasma, which replaces some $CH_3$ moieties with OH moieties that reduce the interfacial surface tension between a wet clean chemical and low-k dielectric.

In another manifestation of the invention, a method for repairing damage to a silicon based low-k dielectric layer with organic compounds, where damage replaces a methyl attached to silicon with a hydroxyl attached to silicon is provided. A mixture gas is provided, comprising a catalyst gas comprising a Lewis base gas and a alkoxysilane containing gas. A monolayer of an alkoxysilane is bound on the silicon based low-k dielectric layer.

These and other features of the present invention will be described in more details below in the detailed description of the invention and in conjunction with the following figures.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION OF THE PREFERRED EMBODIMENTS

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

As dimensions of integrated circuit devices continue to decrease, propagation delay must be decreased, which may be done by lowering the capacitance of surrounding dielectric material. In the specification and claims, a low-k material is defined as having a dielectric constant $k<3.0$. Such low-k dielectric materials may be silicon based, such as silicon oxide, with organic compounds, to lower the dielectric constant, such as organosilicate glass (OSG) and tetraethylorthosilicate (TEOS). For silicon based low-k dielectric materials, such material may be formed to be an ultra low-k ($k<2.8$) by forming nanopores in the low-k dielectric material, which is referred to as nanoporous ultra low-k dielectric material.

In semiconductor via first trench last (VFTL) dual damascene (DD) processing, silicon oxide based low dielectric constant (low-k) materials with added organic components to provide a lower dielectric constant are exposed to various reactants during etch and resist strip process. The exposed low-k dielectric materials are often damaged by etch/strip plasmas and chemicals. In general, low-k damage includes changes in material composition (e.g., carbon depletion), morphology (density or porosity), and/or surface property (e.g., hydrophobic to hydrophilic). The damaged layer no longer possesses the intended dielectric properties, and can lead to device yield loss and/or reliability failures. Therefore, reducing damage during low-k dielectric etch/strip has become one of the most critical challenges in semiconductor processing. Unlike the pristine (undamaged) low-k materials, the damaged layer can be readily removed by dilute HF solution. It is a common practice to quantify low-k material damage after etch and strip by measuring the material loss after dipping the sample in dilute HF solution. For nanoporous ultra low-k dielectric material, such damage may be increased because the pores provide an increased surface area over which the damage may occur and they lead to enhanced diffusion of damaging radicals within the dielectric film.

Efforts have been made to reduce damage during low-k dielectric etch and strip processes. The prior art methods are primarily in the optimization of etch and strip processes by optimizing process chemistry, hardware configuration, and/or plasma sources (e.g. RF vs. microwave) etc. These prior art efforts have resulted in only limited success. As the dielectric constant (k value) continues to reduce, and the material becomes more porous, and the critical dimension becomes smaller, damage becomes a more severe issue in the most advanced integrated circuit processing.

Another prior art method is to repair the damaged layer after etching and stripping of the low-k dielectric materials. Although this approach can repair some of the damages in the low-k dielectric materials, such repairs may make the resulting layer too hydrophobic, which limits wetting during processes such as wet cleaning, ultimately leading to device failures.

PCT application WO 2009/085098A1 by James Deyoung, and entitled "Vapor Phase Repair and Pore Sealing of Low-k Dielectric Material," which is incorporated by reference for all purposes, provides a repair process by sequentially providing a catalyst followed by an alkoxysilane repair agent.

Figure 1:
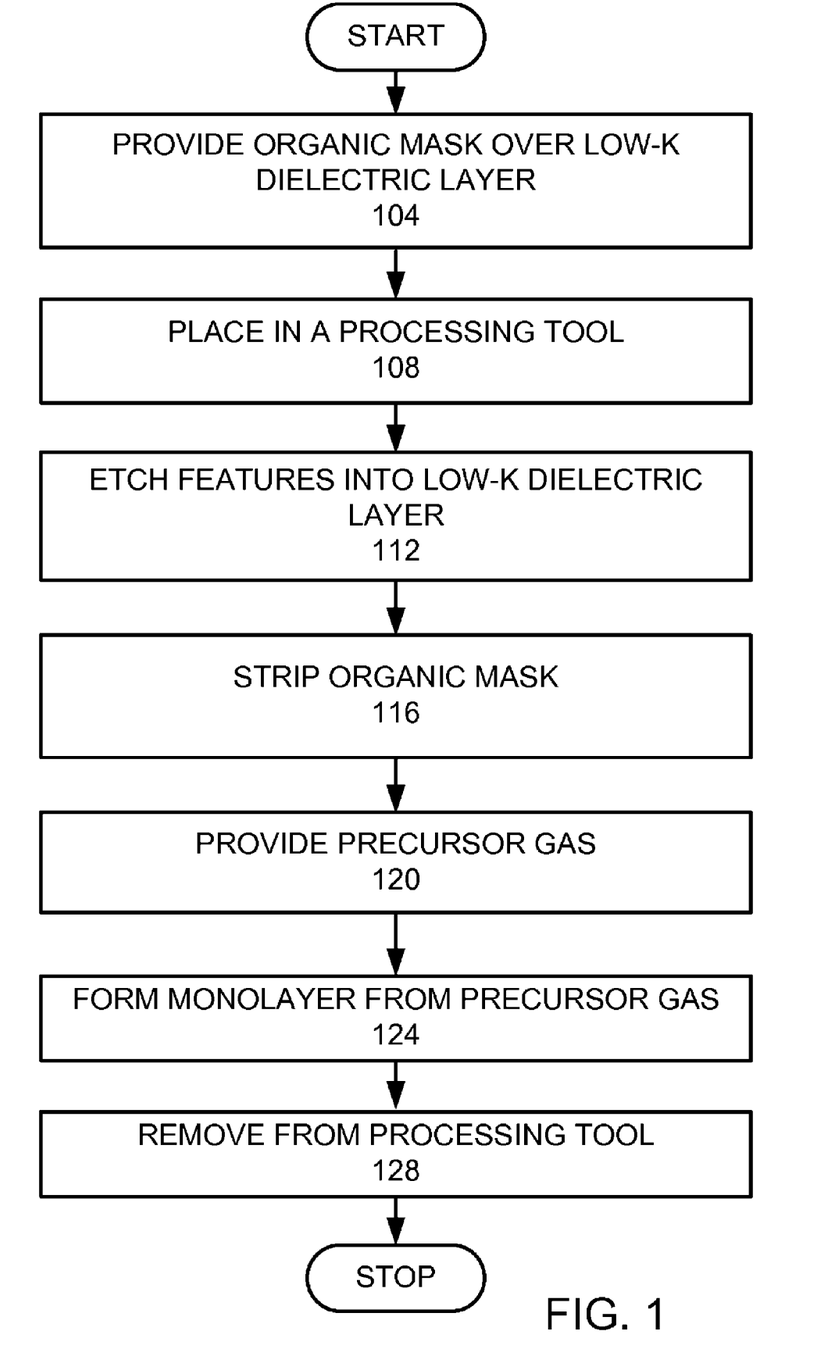
FIG. 1 is a flow chart of an embodiment of the invention.
Figure 2A:
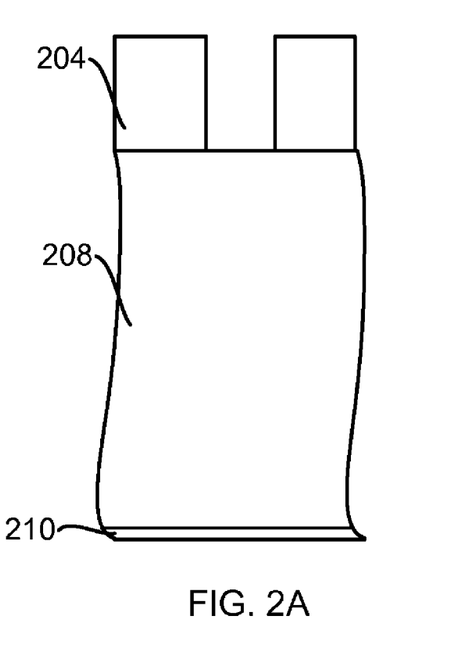
FIGS. 2A-B are schematic views of the formation of a feature using the inventive process.

FIG. 1 is a high level flow chart of an embodiment of the invention, which provides a tuned repair process. The tuned repair process repairs damaged low-k dielectric material, while allowing a tuning for a desired combination of hydrophobic and hydrophilic characteristics. In this embodiment, a patterned organic mask is formed over a low-k dielectric layer (step 104). FIG. 2A is a schematic cross-sectional view of a substrate 210, over which a low-k dielectric layer 208 is disposed, over which a patterned organic mask 204 has been form. One or more intermediate layers may be disposed between the substrate (wafer) 210 and the low-k dielectric layer 208. One or more intermediate layers, such as an anti-reflective coating, may be disposed between the low-k dielectric layer 208 and the patterned organic mask 204.

Figure 3:
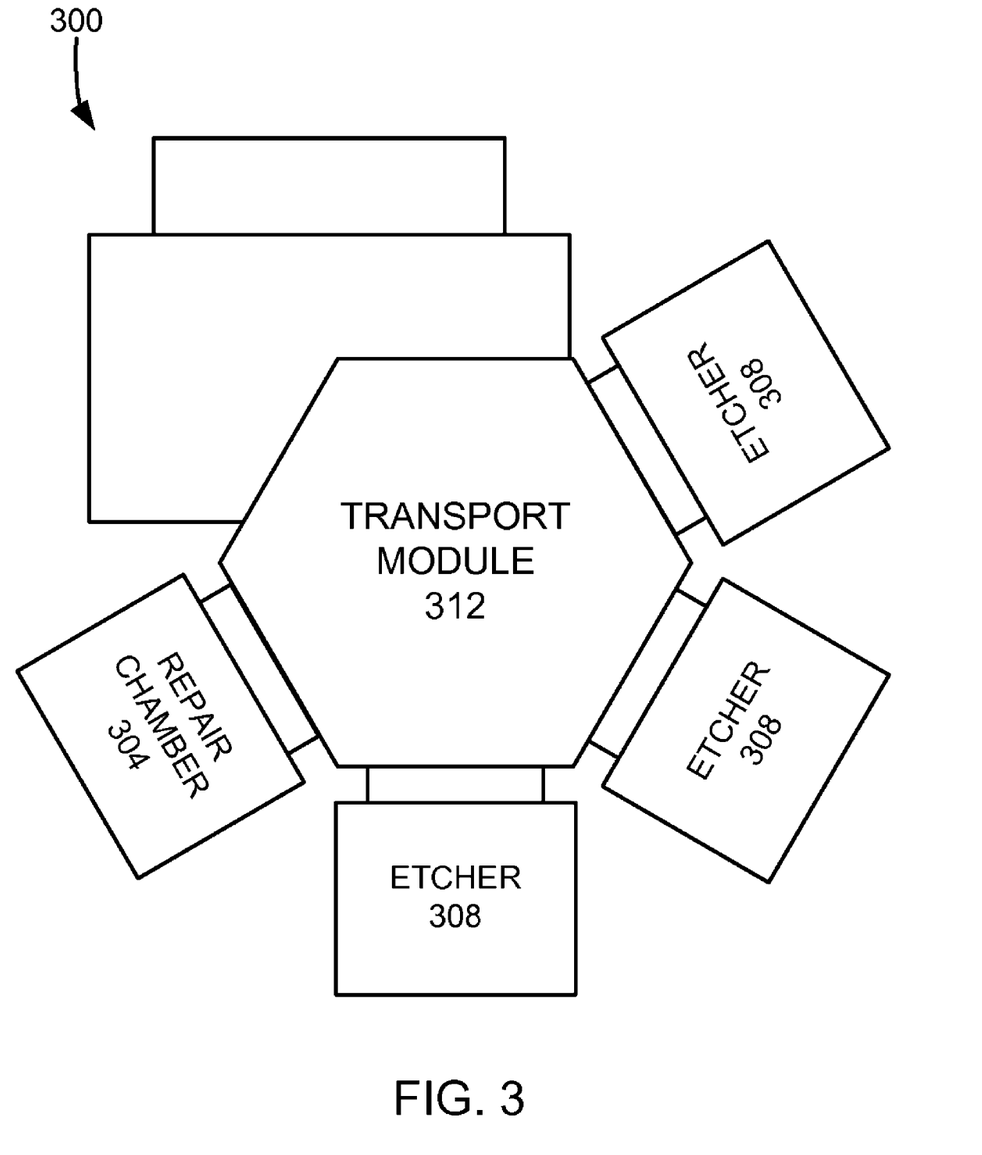
FIG. 3 is a schematic view of a system that may be used in practicing the invention.

The substrate 210 is placed in a processing tool (step 108). FIG. 3 is a schematic top view of a processing tool 300 that may be used in the preferred embodiment of the invention. In this embodiment, the processing tool 300 comprises a repair chamber 304, a plurality of plasma processing chambers, such as etchers 308, and a transport module 312. The transport module 312 is placed between the repair chamber 304 and etchers 308 to allow movement of a wafer into and out of the repair chamber 304 and plurality of etchers 308, while maintaining a vacuum.

Figure 2B:
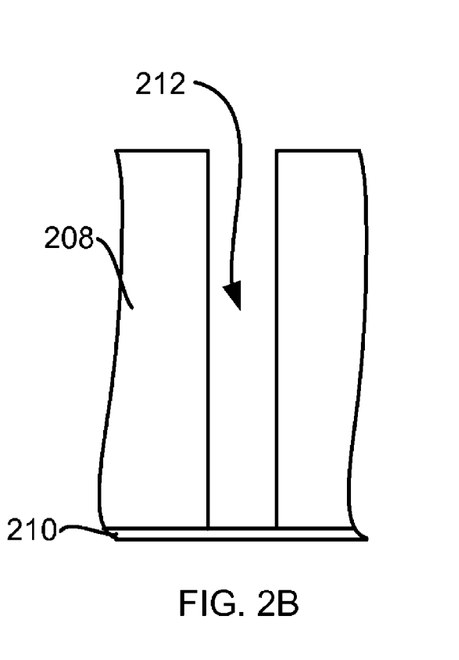

In this embodiment, the substrate 210 is placed in the transport module 312 of the processing tool 300, where a vacuum is created. The transport module 312 moves the substrate 210 into an etcher 308. In the etcher 308, an etch is performed to form features into the low-k dielectric layer (step 112). In this embodiment, the organic mask is then stripped (step 116). FIG. 2B is a schematic cross-sectional view of a substrate 210 and low-k dielectric layer 208 after features 212 have been etched into the low-k dielectric layer 208 and the organic mask has been stripped. In this embodiment, the stripping is performed in the etcher 308. In other embodiments a strip tool may be connected to the transport module 312, where the transport module 312 moves the substrate 210 from the etcher 308 to the strip tool, without breaking the vacuum.

The transport tool then moves the substrate 210 to the repair chamber 304. In another embodiment the processing tool 300 may be a single chamber with a single electrostatic chuck which holds the substrate 210 during the etching, stripping and repairing.

Figure 4A:
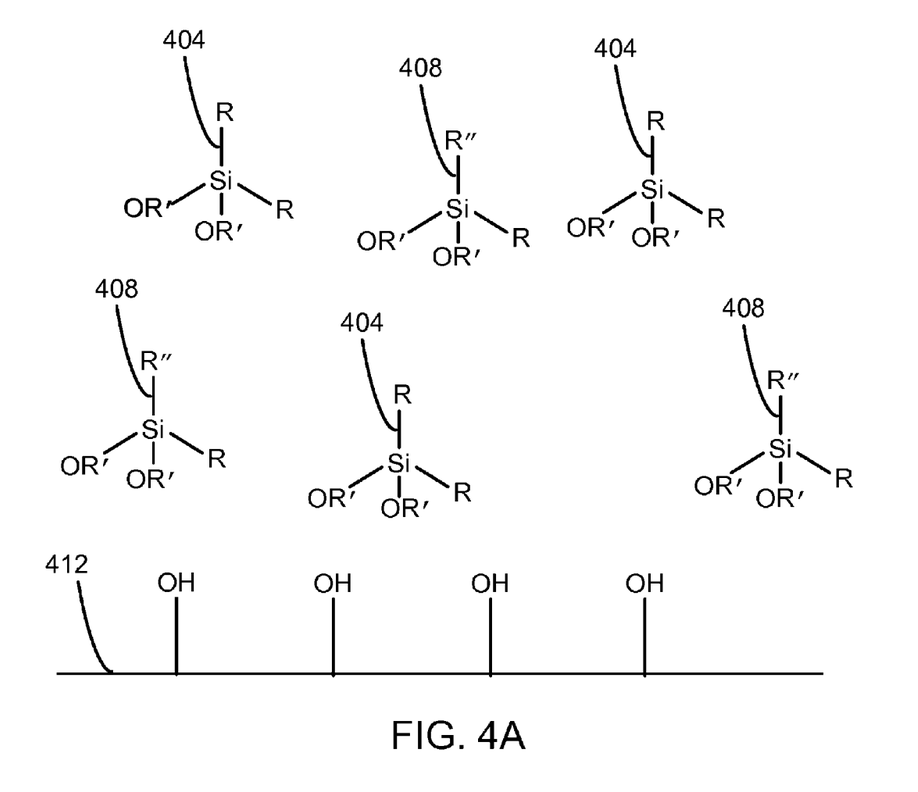
FIGS. 4A-B are schematic views of a repair process.
Figure 4B:
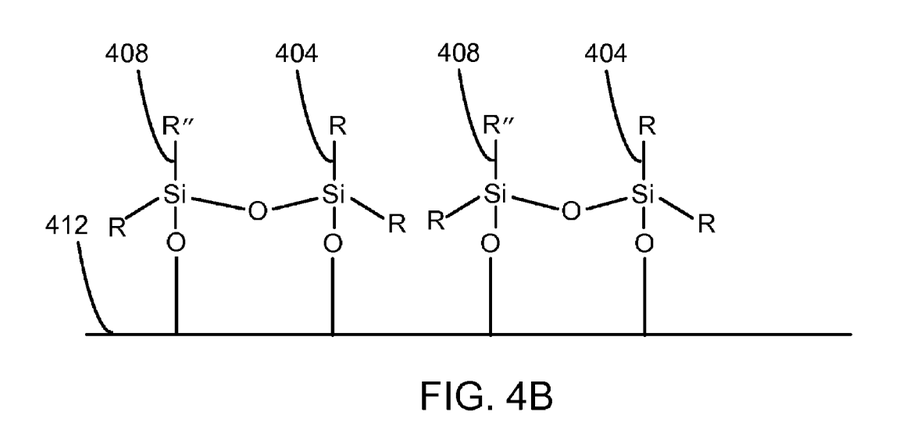

In the repair tool, a precursor gas is provided (step 120). The precursor gas comprises a first repair agent represented as Si—$(R)_x(OR')_y$, where $y \geq 1$ and $x+y=4$, and wherein R is an alkyl or aryl group and R' is an alkyl or aryl group, and a second repair agent represented as Si—$(R)_x(OR')_y R''$, where $y \geq 1$ and $x+y=3$, and wherein R is an alkyl or aryl group and R' is an alkyl or aryl group, and R'' is of a group that reduces interfacial surface tension between a wet clean chemical and the low-k dielectric compared to R and R'. Preferably, R'' is an amino group, a phenyl group, cyano group, chloro group, thiol group, epoxy group, vinyl group, or cyclic azasiline group. FIG. 4A is a schematic illustration of the precursor gas comprising the first repair agent 404 and the second repair agent 408 near the dielectric layer 412 with OH groups. Conditions are provided in the repair tool to cause bonding of some of the first repair agent and second repair agent to the low-k dielectric to form a monolayer of the first repair agent and the second repair agent (step 124). FIG. 4B is a schematic view of how a monolayer is formed from the precursor gas. The first and second repair agents 404, 408 bond to the dielectric layer 412 at the sites of the OH groups. Some of the first and second repair agents 404, 408 may also form lateral bonds that strengthen the monolayer. The substrate may then be removed from the processing tool 300 (step 128).

It is believed that the ratio of first repair agent to the second repair agent in the precursor gas should be related to the ratio of the first repair agent to the second repair agent that forms the monomer layer. Since the first repair agent provides a monomer layer that is hydrophobic and the second repair layer provides a monomer layer that is more hydrophilic and the ratio of the first repair agent and the second repair agent may be controlled, the resulting monomer repair layer may be tuned to the desired combination of hydrophobic and hydrophilic properties. Therefore, this embodiment of the invention provides a tuned repair.

Example

A more specific example of an embodiment of the invention provides a substrate 210 where the low-k dielectric layer 208 is a nanoporous organosilicate glass. The organic mask 204 is a multi-layer photoresist mask comprising 193 nm photoresist, an organic antireflective coating, and an organic optical planarization layer (step 104).

The substrate 210 is placed in a the processing tool 300 (step 108).

In this example, the substrate 210 is placed in the transport module 312 of the processing tool 300. The transport module 312 moves the substrate 210 to an etcher 308. In this example features 212 (FIG. 2B) are etched into the low-k dielectric layer (step 112) and the organic mask is stripped (step 116) in the etcher 308. Conventional organosilicate glass etching and photoresist stripping processes may be used.

In this example, the transport module 312 moves the substrate 210 to the repair chamber 304, although in other embodiments the stripping, etching, and repair may be done in a single etcher chamber. In this example, the providing of the precursor gas provides a first repair agent of dimethyldimethoxysilane and a second repair agent of n-aminopropyltrimethoxysilane. In addition, a catalyst gas of ammonia is simultaneously provided with the precursor gas. In other embodiments, the catalyst gas may be any Lewis base gas.

More preferably, the catalyst gas is a Lewis base amine. Conditions are provided to facilitate the bonding of the first repair agent and second repair agent to the low-k dielectric layer. In this example such conditions are a gas pressure of 140 Torr and a wafer temperature of 60° C. For more complex and higher order amines the temperature may be higher.

The transfer module 312 moves the substrate 210 from the repair chamber 304 out of the processing tool (step 128).

Plasma Embodiment

Figure 6:
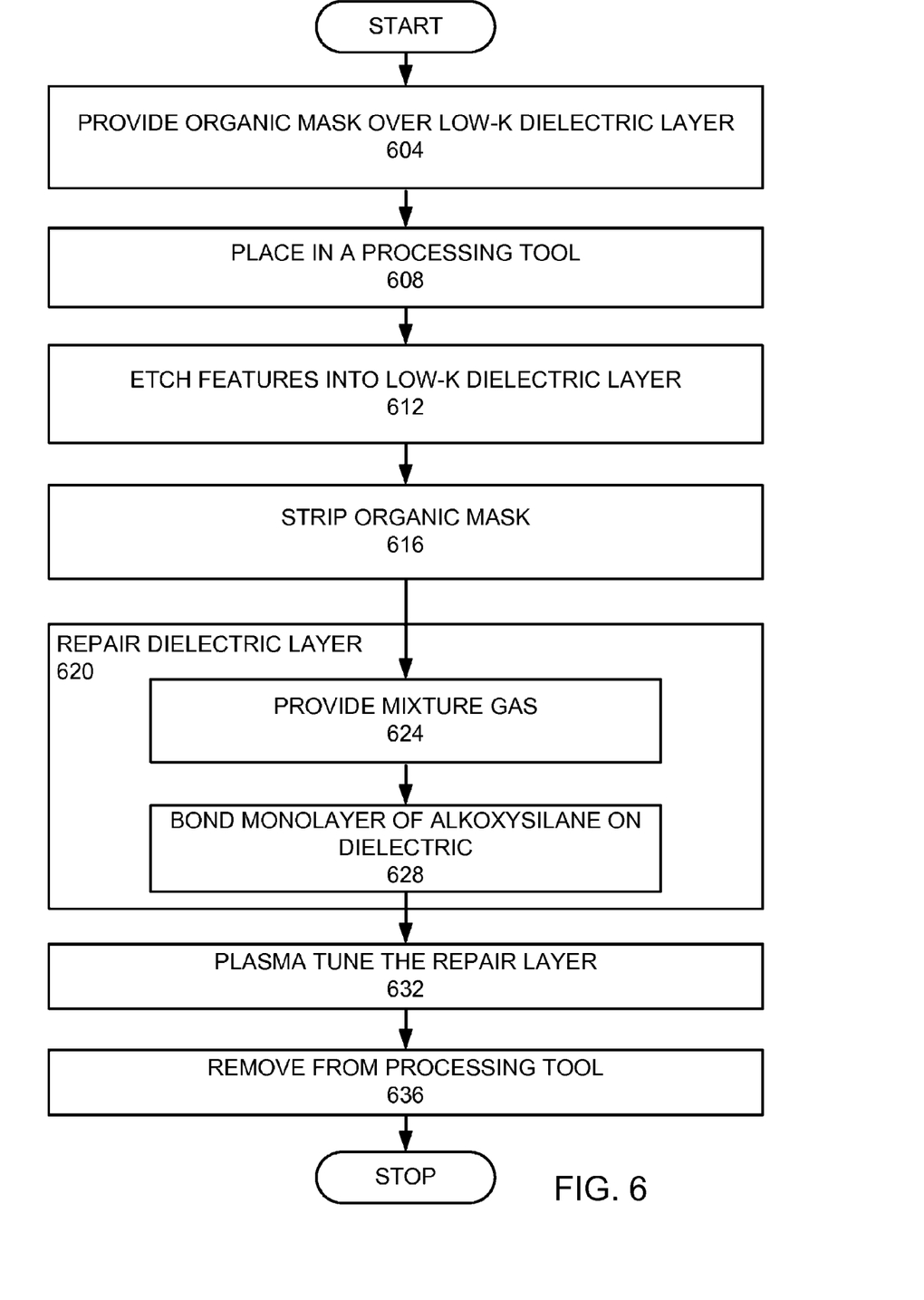
FIG. 6 is a flow chart of another embodiment of the inventive etch process.

FIG. 6 is a flow chart of another embodiment using a simultaneous repair precursor with a catalyst and a repair plasma. As in the previous embodiment, an organic mask is formed over a low-k dielectric layer, which is over a substrate (step 604). The organic mask, low-k dielectric layer, and substrate may be the same as shown in FIG. 2A. The substrate is placed in a processing tool (step 608), which may be a processing tool like the processing tool 300 in FIG. 3. Etch features are etched into the low-k dielectric layer (step 612). Such features may be like the features 212 shown in FIG. 2B. The organic mask is stripped (step 616). The dielectric layer is repaired (step 620). In this example of this embodiment, the repair is performed in two steps, which are performed simultaneously. A mixture gas is provided to a repair chamber (step 624). The mixture gas comprises a catalyst gas comprising a Lewis base gas, and the mixture gas further comprises an alkoxysilane containing gas. An alkoxysilane is defined as a silicon atom with two classes of moieties attached to form $R_nSiX_{(r-n)}$, where R is a nonhydrolyzable organic moiety that can be either an alkyl, aromatic, organofunctional, or a combination of these groups, and X is hydrolysable alkoxysilane group. Conditions are provided to cause the alkoxysilane to form a repair monolayer on a silicon based low-k dielectric (step 628). In other examples, other repair processes may be used to provide a repair monolayer. Such repair processes in this embodiment of the invention form a repair layer on a surface of the damaged silicon based low-k dielectric layer by replacing silanol (Si—OH) bonds with Si—C or $CH_3$ bonds. The low-k dielectric layer is then subjected to a non-etching plasma that replaces some of the $CH_3$ moieties with OH moieties. The plasma accomplishes this by preferably providing either ion bombardment or UV or VUV radiation. The time and other parameters of the plasma treatment may be controlled to control the percentage of $CH_3$ moieties that are replaced with OH moieties. This control provides a tuning to provide a desired combination of hydrophobic and hydrophilic properties.

Figure 7A:
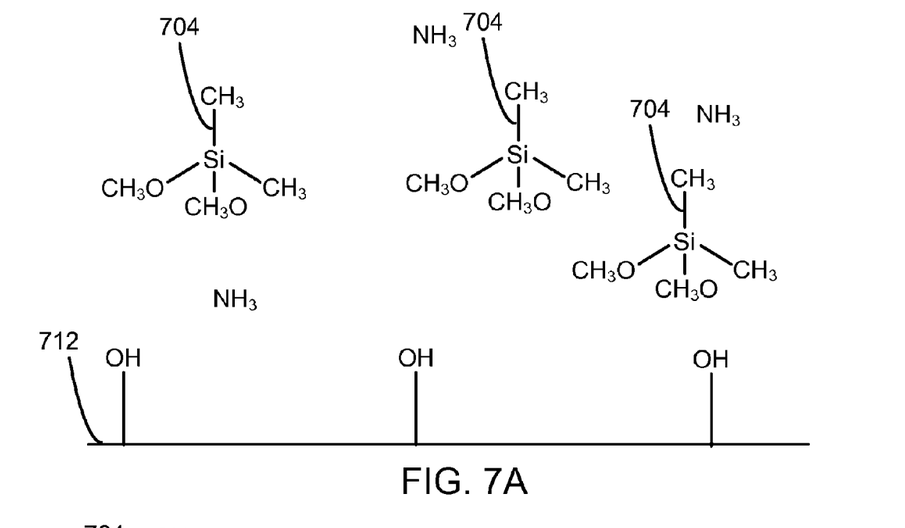
FIGS. 7A-D are schematic views of another repair process.
Figure 7B:
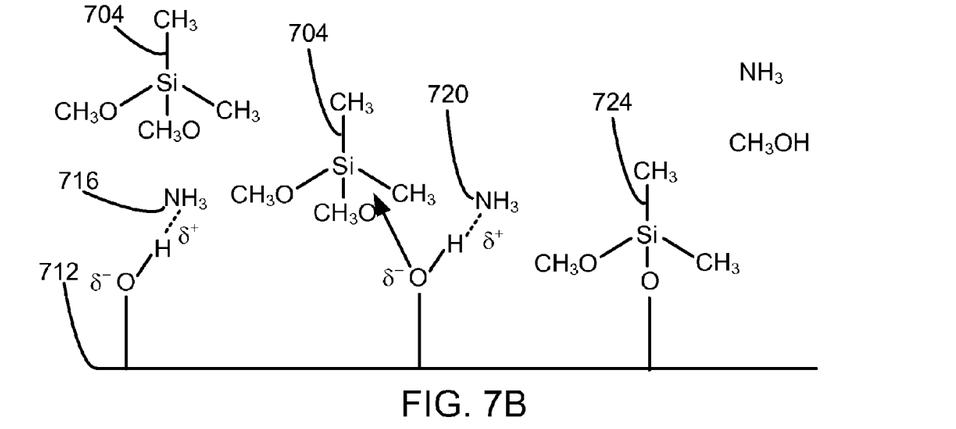
Figure 7C:
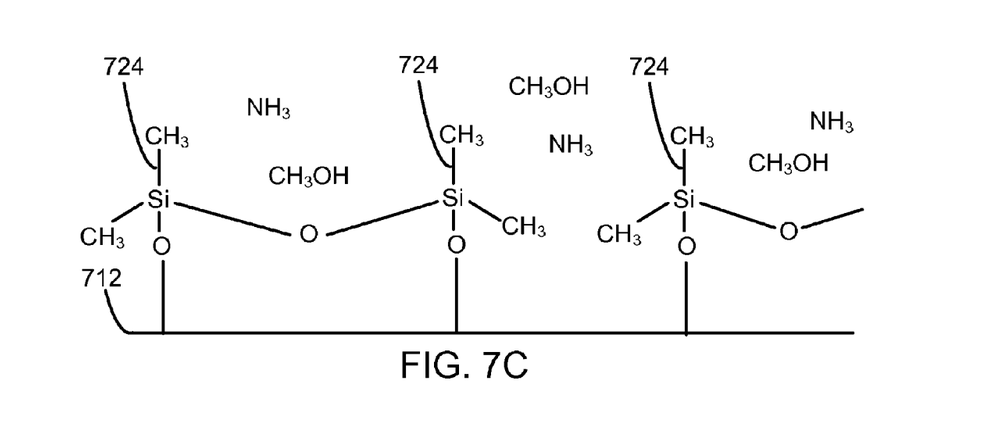

In an example of this embodiment, which uses a simultaneous mixture of a catalyst gas and an alkoxysilane gas, the catalyst gas is preferably a Lewis base amine. In this example, the catalyst gas is more preferably an amine, such as ammonia. In this example, the alkoxysilane is dimethyldimethoxysilane. FIG. 7A is a schematic illustration of a gas mixture of a catalyst gas comprising a ammonia gas and an alkoxysilane containing gas of dimethyldimethoxysilane 704 being provided to a low-k dielectric 712 with hydroxyl groups of silanols. Conditions are provided to form a monolayer. FIG. 7B shows how one ammonia molecule 716 acts as a catalyst and hydrogen bonds with the hydroxyl group of a silanol, which increases acidity of the hydroxyl group, as shown by the ☐⁺ and ☐⁻. FIG. 7B also shows how another ammonia catalyst 720 has hydrogen bonded with the hydrogen of a hydroxyl group, which increased the acidity of the hydroxyl group causing a direct reaction between a dimethyldimethoxysilane molecule and the hydroxyl group. FIG. 7B also shows how an alkoxysilane molecule 724 has bonded to a silanol, where an ammonia catalyst is released and a methanol molecule is produced. Therefore, the Lewis base is able to physiosorb to a hydroxyl attached to silicon, which causes silicon of the alkoxysilane to bond with oxygen of the hydroxyl. FIG. 7C shows alkoxysilane molecules 724 bonded to the dielectric surface. Because such bonding is limited to a single layer, such a process forms a monolayer. Optimal conditions are provided to form the monolayer, preferably by providing conditions to cause adjacent methoxy groups to bond to adjacent precursor, as shown in FIG. 7C. Otherwise, without such optimal conditions, the dimethoxy groups can vertically polymerize, so that layer thicker than a monolayer is formed.

Preferably, this process is provided at a temperature of less than 60° C. An actual recipe used in an embodiment of the invention is a gas composition of 63% by volume dimethyldimethoxysilane, 30% by volume $NH_3$, with the balance $N_2$ at a total gas pressure of 130 Torr and a wafer temperature of 55° C.

Figure 8:
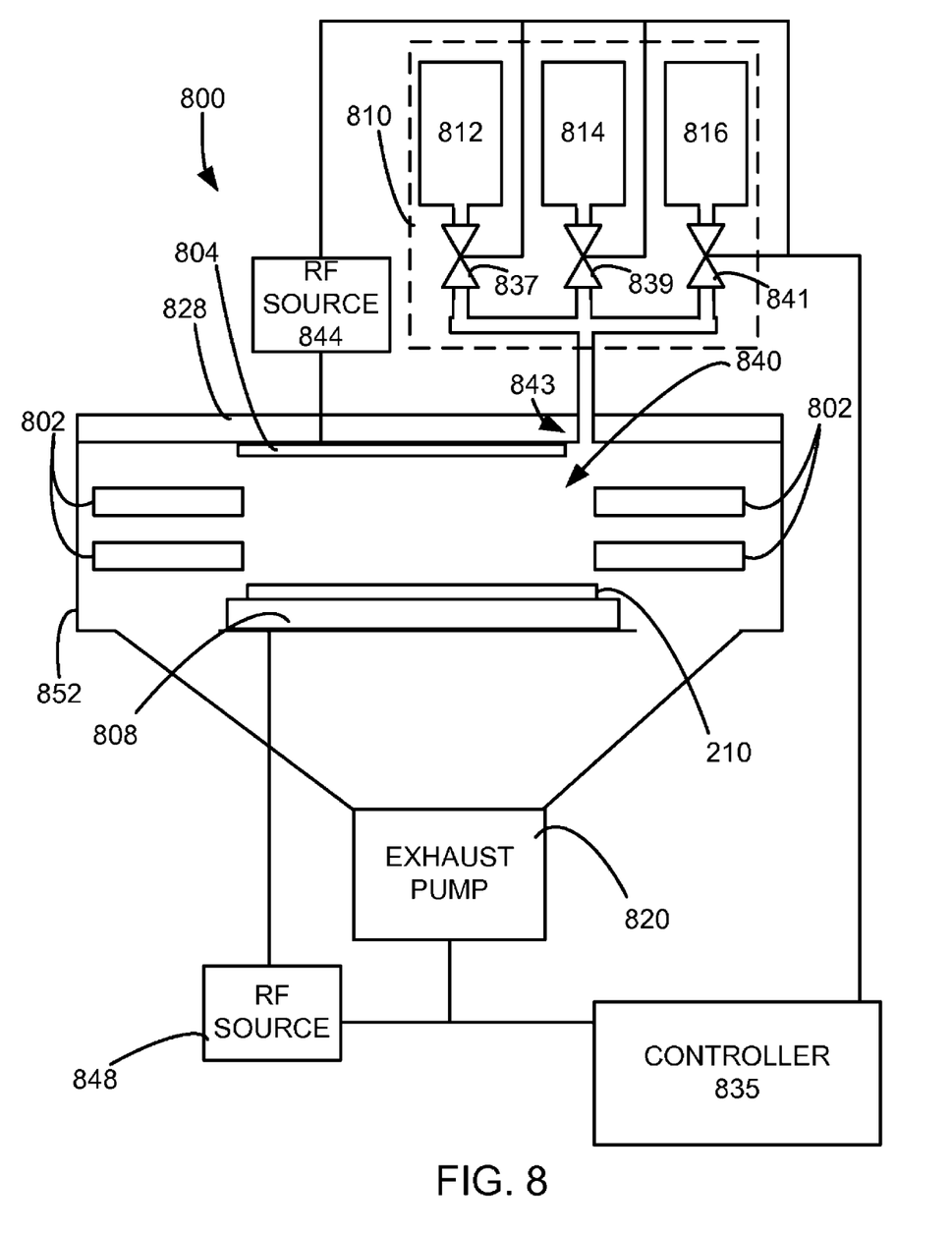
FIG. 8 is a schematic view of a system that may be used in practicing the invention.

The repaired low-k dielectric layer over a substrate is then placed in a plasma chamber to provide plasma tuning of the hydrophilic properties. FIG. 8 is a schematic view of a plasma processing chamber 800 that may be used in the preferred embodiment of the invention for treating the repair layer. In this embodiment, the plasma processing chamber 800 comprises confinement rings 802, an upper electrode 804, a lower electrode 808, a gas source 810, and an exhaust pump 820. The gas source 810 comprises an inert gas source 812. Other gas sources 814, 816 may be provided to either tune the repair layer or perform other tasks, such as stripping the photoresist. Within plasma processing chamber 800, the substrate 210 is positioned upon the lower electrode 808. The lower electrode 808 incorporates a suitable substrate chucking mechanism (e.g., electrostatic, mechanical clamping, or the like) for holding the substrate 210. The reactor top 828 incorporates the upper electrode 804 disposed immediately opposite the lower electrode 808. The upper electrode 804, lower electrode 808, and confinement rings 802 define the confined plasma volume 840. Gas is supplied to the confined plasma volume by gas source 810 through a gas inlet 843 and is exhausted from the confined plasma volume through the confinement rings 802 and an exhaust port by the exhaust pump 820. The exhaust pump 820 forms a gas outlet for the plasma processing chamber. A first RF source 844 is electrically connected to the upper electrode 804. A second RF source 848 is electrically connected to the lower electrode 808. Chamber walls 852 define a plasma enclosure in which the confinement rings 802, the upper electrode 804, and the lower electrode 808 are disposed. Both the first RF source 844 and the second RF source 848 may comprise a 60 MHz power source, a 27 MHz power source, and a 2 MHz power source. Different combinations of connecting RF power to the electrode are possible. A 2300® Exelan® Flex EL dielectric etch system made by Lam Research Corporation™ of Fremont, Calif. may be used in a preferred embodiment of the invention. A controller 835 is controllably connected to the first RF source 844, the second RF source 848, the exhaust pump 820, a first control valve 837 connected to the inert gas source 812, a second control valve 839 connected to the second gas source 814, and a third control valve 841 connected to the third gas source 816. The gas inlet 843 provides gas from the gas sources 812, 814, 816 into the plasma processing enclosure. A showerhead may be connected to the gas inlet 843. The gas inlet 843 may be a single inlet for each gas source or a different inlet for each gas source or a plurality of inlets for each gas source or other possible combinations.

Figure 5A:
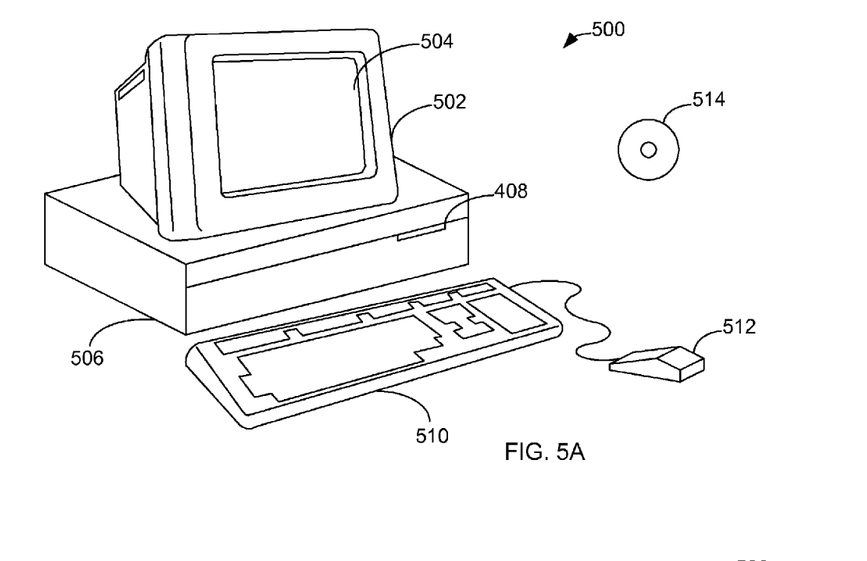
FIGS. 5A-B are schematic views of a computer system that may be used in practicing the invention.
Figure 5B:
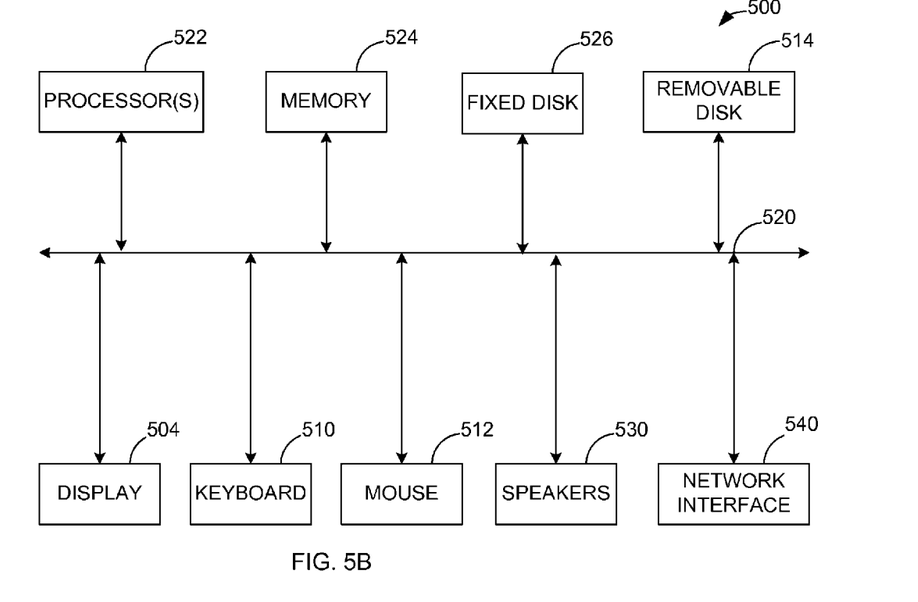

FIGS. 5A and 5B illustrate a computer system 500, which is suitable for using as a controller for the processing tool. Such a controller may be used to transport the substrates between different process chambers and to control the processes in the process chamber. FIG. 5A shows one possible physical form of a computer system that may be used for the controller 835. Of course, the computer system may have many physical forms ranging from an integrated circuit, a printed circuit board, and a small handheld device up to a huge super computer. Computer system 500 includes a monitor 502, a display 504, a housing 506, a disk drive 508, a keyboard 510, and a mouse 512. Disk 514 is a computer-readable medium used to transfer data to and from computer system 500.

FIG. 5B is an example of a block diagram for computer system 500. Attached to system bus 520 is a wide variety of subsystems. Processor(s) 522 (also referred to as central processing units, or CPUs) are coupled to storage devices, including memory 524. Memory 524 includes random access memory (RAM) and read-only memory (ROM). As is well known in the art, ROM acts to transfer data and instructions uni-directionally to the CPU and RAM is used typically to transfer data and instructions in a bi-directional manner. Both of these types of memories may include any suitable type of the computer-readable media described below. A fixed disk 526 is also coupled bi-directionally to CPU 522; it provides additional data storage capacity and may also include any of the computer-readable media described below. Fixed disk 526 may be used to store programs, data, and the like and is typically a secondary storage medium (such as a hard disk) that is slower than primary storage. It will be appreciated that the information retained within fixed disk 526 may, in appropriate cases, be incorporated in standard fashion as virtual memory in memory 524. Removable disk 514 may take the form of any of the computer-readable media described below.

CPU 522 may be also coupled to a variety of input/output devices, such as display 504, keyboard 510, mouse 512, and speakers 530. In general, an input/output device may be any of: video displays, track balls, mice, keyboards, microphones, touch-sensitive displays, transducer card readers, magnetic or paper tape readers, tablets, styluses, voice or handwriting recognizers, biometrics readers, or other computers. CPU 522 optionally may be coupled to another computer or telecommunications network using network interface 540. With such a network interface, it is contemplated that the CPU might receive information from the network, or might output information to the network in the course of performing the above-described method steps. Furthermore, method embodiments of the present invention may execute solely upon CPU 522 or may execute over a network such as the Internet in conjunction with a remote CPU that shares a portion of the processing.

In addition, embodiments of the present invention further relate to computer storage products with a computer-readable medium that have computer code thereon for performing various computer-implemented operations. The media and computer code may be those specially designed and constructed for the purposes of the present invention, or they may be of the kind well known and available to those having skill in the computer software arts. Examples of tangible computer-readable media include, but are not limited to: magnetic media such as hard disks, floppy disks, and magnetic tape; optical media such as CD-ROMs and holographic devices; magneto-optical media such as floptical disks; and hardware devices that are specially configured to store and execute program code, such as application-specific integrated circuits (ASICs), programmable logic devices (PLDs) and ROM and RAM devices. Examples of computer code include machine code, such as produced by a compiler, and files containing higher level code that are executed by a computer using an interpreter. Computer readable media may also be computer code transmitted by a computer data signal embodied in a carrier wave and representing a sequence of instructions that are executable by a processor. In one embodiment of the invention, the same plasma processing chamber may be used for etching, stripping, and tuning the repair layer. In another embodiment, the same plasma processing chamber may also be used for repairing the dielectric layer. In another embodiment, different plasma processing chambers may be used for etching and tuning the repair layer.

Figure 7D:
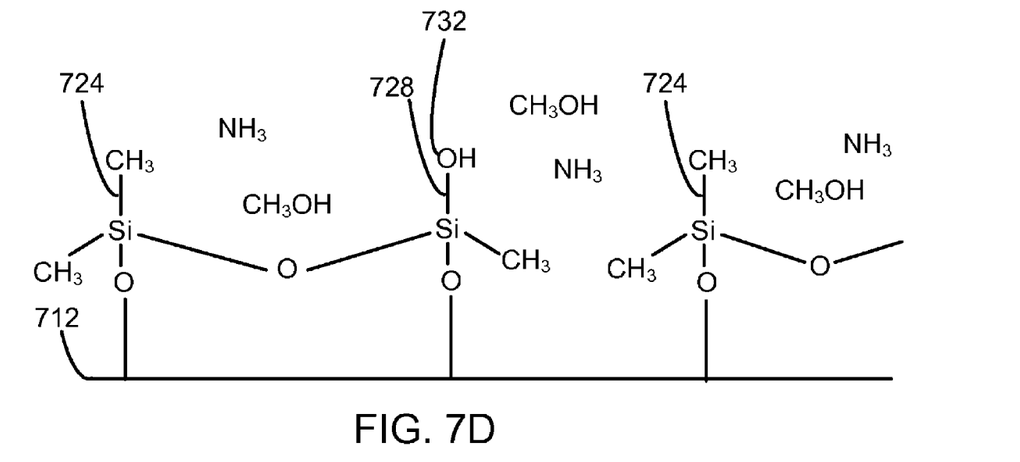

An example of a recipe for a repair layer plasma tuning process is supplying RF power of 50 watts at 27 MHz to gas flow of 500 sccm Ar at a pressure of 50 mTorr for 15 seconds. Preferably the plasma tuning uses a tuning gas that consists essentially of an inert gas, which helps to eliminate chemical etching. In another embodiment, the tuning gas consists essentially of an inert gas and an $O_2$ gas. FIG. 7D shows that for one alkoxysilane molecule 728 bonded to silanol, a $CH_3$ moiety has been replaced by an OH moiety 732. The amount of such replacement may be tuned by the time and other factors of the plasma exposure.

In another embodiment, the repair layer is provided before the organic mask is stripped.

In another embodiment, the forming the repair layer may use a repair gas with more than 50% by volume flow of $CH_4$, which is described in more detail in U.S. patent application Ser. No. 12/604,224, entitled METHOD FOR REPAIRING LOW-K DIELECTRIC DAMAGE, by Stephen Sirard, filed on the same date as the present application, and which is incorporated by reference for all purposes.

While this invention has been described in terms of several preferred embodiments, there are alterations, permutations, and substitute equivalents, which fall within the scope of this invention. It should also be noted that there are many alternative ways of implementing the methods and apparatuses of the present invention. It is therefore intended that the following appended claims be interpreted as including all such alterations, permutations, and substitute equivalents as fall within the true spirit and scope of the present invention.

What is claimed is:

1. A method for providing a tuned repair for damage to a silicon based low-k dielectric layer with organic compounds, where damage replaces a methyl attached to silicon with a hydroxyl attached to silicon, comprising:
   providing a precursor gas, comprising:
   a first repair agent represented as Si—$(R)_x(OR')_y$, where $y \geq 1$ and $x+y=4$, and wherein R is an alkyl or aryl group and R' is an alkyl or aryl group; and
   a second repair agent represented as Si—$(R)_x(OR')_y R''$, where $y \geq 1$ and $x+y=3$, and wherein R is an alkyl or aryl group and R' is an alkyl or aryl group, and R' is of a group that reduces interfacial surface tension between a wet clean chemical and the low-k dielectric; and
   bonding some of the first repair agent and second repair agent to the low-k dielectric to form a monolayer of the first repair agent and the second repair agent.

2. The method, as recited in claim 1, wherein R" is an amino group, a phenyl group, cyano group, chloro group, thiol group, epoxy group, vinyl group, or cyclic azasiline group.

3. The method, as recited in claim 2, wherein a photoresist mask is formed over the silicon based low-k dielectric layer and further comprising stripping the photoresist mask after bonding some of the first repair agent and second repair agent to the low-k dielectric to form a monolayer of the first repair agent and the second repair agent.

4. The method, as recited in claim 2, wherein a photoresist mask is formed over the silicon based low-k layer and further comprising stripping the photoresist mask before providing a precursor gas.

5. The method, as recited in claim 4, further comprising etching features in the silicon based low-k dielectric layer after the photoresist mask is formed and before stripping the photoresist mask.

6. The method, as recited in claim 1, wherein the bonding comprises providing a precursor gas comprising a Lewis base gas.

7. The method, as recited in claim 6, wherein the bonding further comprises providing a plasma free environment.

8. A method for repairing damage to a silicon based low-k dielectric layer with organic compounds, where damage replaces a methyl attached to silicon with a hydroxyl attached to silicon, comprising:
   etching the silicon based low-k dielectric layer through a photoresist mask;
   providing a mixture gas, comprising:
      a catalyst gas comprising a Lewis base gas; and
      a alkoxysilane containing gas; and
   binding a monolayer of an alkoxysilane on the silicon based low-k dielectric layer; and
   stripping the photoresist mask after binding the monolayer.

9. The method of claim 8, wherein the binding the monolayer comprises, providing conditions to cause a Lewis base to physiosorb to a hydroxyl attached to silicon and to cause silicon of the alkoxysilane to bond with oxygen of the hydroxyl.

10. The method, as recited in claim 9, wherein the Lewis base gas is an amine gas.

11. The method, as recited in claim 10, wherein the during the providing the mixture gas a wafer temperature is kept below 60° C.

12. The method, as recited in claim 11, wherein a vacuum is maintained from before the etching until after binding the monolayer.

\* \* \* \* \*

UNITED STATES PATENT AND TRADEMARK OFFICE
CERTIFICATE OF CORRECTION

| | | |
|---|---|---|
| PATENT NO. | : 7,981,699 B2 | Page 1 of 1 |
| APPLICATION NO. | : 12/604222 | |
| DATED | : July 19, 2011 | |
| INVENTOR(S) | : Sirard et al. | |

It is certified that error appears in the above-identified patent and that said Letters Patent is hereby corrected as shown below:

In the Claims

Please replace Column 8, Line no. 51 with

-- aryl group and R' is an alkyl or aryl group, and R" is of --

Signed and Sealed this
Thirtieth Day of June, 2015

Michelle K. Lee
*Director of the United States Patent and Trademark Office*